United States Patent
Xiao et al.

(10) Patent No.: US 10,490,151 B2
(45) Date of Patent: Nov. 26, 2019

(54) GATE DRIVING CIRCUIT

(71) Applicant: Wuhan China Star Optoelectronics Technology Co., Ltd., Wuhan, Hubei (CN)

(72) Inventors: Juncheng Xiao, Guangdong (CN); Ronglei Dai, Guangdong (CN)

(73) Assignee: WUHAN CHINA STAR OPTOTELECTRONICS TECHNOLOGY CO., LTD., Wuhan (CN)

(*) Notice: Subject to any disclaimer, the term of this patent is extended or adjusted under 35 U.S.C. 154(b) by 9 days.

(21) Appl. No.: 15/969,129

(22) Filed: May 2, 2018

(65) Prior Publication Data

US 2019/0130858 A1     May 2, 2019

Related U.S. Application Data

(63) Continuation of application No. PCT/CN2018/071660, filed on Jan. 5, 2018.

(30) Foreign Application Priority Data

Oct. 31, 2017     (CN) .......................... 2017 1 1069557

(51) Int. Cl.
 *G09G 3/36* (2006.01)
 *G11C 19/28* (2006.01)

(52) U.S. Cl.
 CPC ........... *G09G 3/3677* (2013.01); *G11C 19/28* (2013.01); *G09G 2310/063* (2013.01); *G09G 2320/0257* (2013.01); *G09G 2330/027* (2013.01)

(58) Field of Classification Search
 CPC .............. G09G 3/3674; G09G 3/3677; G09G 2300/0408; G09G 2310/0245;
 (Continued)

(56) References Cited

U.S. PATENT DOCUMENTS 9,269,318 B2 *   2/2016  Sasaki ................. G09G 3/3677
2010/0079443 A1 *  4/2010  Chang .................. G09G 3/3677
                                                    345/214
(Continued)

FOREIGN PATENT DOCUMENTS

CN         102831867 A      12/2012
CN         104464666 A       3/2015
(Continued)

*Primary Examiner* — Patrick O Neill
(74) *Attorney, Agent, or Firm* — Hemisphere Law, PLLC; Zhigang Ma (57) ABSTRACT

A gate driving circuit provided in the disclosure comprises a pull-up control module configured to generate a first control signal when power is turned off, a pull-up output module configured to output a high potential under control of the first control signal, a pull-down control module configured to generate a second control signal when power is turned off, and a pull-down output module configured to output a low potential under control of the second control signal. Wherein, the output terminals of the pull-up output module and the pull-down output module are connected to the output terminal of a Nth-stage gate driving unit, and, when power is turned off, the pull-up output module and the pull-down output module together make the output terminal of the Nth-stage gate driving unit output the high potential. The image remained on the liquid crystal screen when power is turned off suddenly is cleaned quickly thereby.

19 Claims, 2 Drawing Sheets

(58) Field of Classification Search
CPC ..... G09G 2310/0286; G09G 2310/061; G09G 2310/063; G09G 2320/0257; G09G 2330/027; G11C 19/28
See application file for complete search history.

(56) References Cited

U.S. PATENT DOCUMENTS

2017/0278451 A1* 9/2017 Peng .................... G09G 3/2092
2019/0066562 A1* 2/2019 Hu ........................... G09G 3/20
2019/0130859 A1* 5/2019 Dai ...................... G09G 3/3677

FOREIGN PATENT DOCUMENTS

| CN | 105575357 A | 5/2016 |
|----|-------------|--------|
| CN | 105957480 A | 9/2016 |
| CN | 106486085 A | 3/2017 |
| CN | 106504720 A | 3/2017 |

* cited by examiner

GATE DRIVING CIRCUIT

RELATED APPLICATIONS

This application is a continuation application of PCT Patent Application No. PCT/CN2018/071660, filed Jan. 5, 2018, which claims the priority benefit of Chinese Patent Application No. 201711069557.0, filed Oct. 31, 2017, which is herein incorporated by reference in its entirety.

FIELD OF THE DISCLOSURE

The disclosure relates to a display technical field, and more particularly to a gate driving circuit.

BACKGROUND

Thin film transistor liquid crystal display (TFT-LCD) has now become the mainstream display on the market. The basic principle is that the liquid crystal in the display is driven to deflect by the voltage and the direction of light is changed so that different color is displayed in the display. A Gate Driver On Array (GOA) circuit is a technology that integrates a gate driving circuit on an array substrate of a liquid crystal display panel to scan the gate lines in sequence. When power is turned off, the LCD screen might remain residual image because charges are remained in the pixel capacitances. In the existed technologies, there is a lack of effective mechanisms to prevent this phenomenon.

SUMMARY

The technique problem to be solved by the present invention is to provide a gate driving circuit to clean the image on the display quickly when power of the liquid crystal screen is turned off.

The present disclosure provides a gate driving circuit comprising a plurality of gate driving units, wherein a Nth-stage gate driving unit comprises:

a pull-up control module configured to generate a first control signal when power is turned off;

a pull-up output module configured to output a high potential under control of the first control signal;

a pull-down control module configured to generate a second control signal when power is turned off; and a pull-down output module configured to output a low potential under control of the second control signal;

wherein, an output terminal of the pull-up output module and an output terminal of the pull-down output module are connected to an output terminal of the Nth-stage gate driving unit, and, when power is turned off, the pull-up output module and the pull-down output module make the output terminal of the Nth-stage gate driving unit output the high potential.

In one embodiment, the pull-up control module comprises a first thin film transistor (TFT), a second TFT, a fifth TFT and a seventh TFT, wherein, a gate terminal of the first TFT receives an output signal of a (N−2)th-stage gate driving unit, a source terminal of the first TFT receives a forward scan signal, and a drain terminal of the first TFT is connected to a drain terminal of the second TFT; a gate terminal of the second TFT receives an output signal of a (N+2)th-stage gate driving unit, and a source of the second TFT receives a reverse scan signal; a gate terminal of the fifth TFT is connected to an output terminal of the pull-down control module, a source terminal of the fifth TFT is connected to the drain terminal of the first TFT, and a drain terminal of the fifth TFT receives a low potential signal; a gate terminal of the seventh TFT receives a high potential signal, a source terminal of the seventh TFT is connected to the drain terminal of the first TFT, and a drain terminal of the seventh TFT is connected to an output terminal of the pull-up control module; wherein the pull-up control module is configured to output the first control signal at the high potential to conduct the pull-up output module.

In one embodiment, the pull-up output module comprises a ninth TFT, a gate terminal of the ninth TFT is connected to the drain terminal of the seventh TFT, a source terminal of the ninth TFT receives a first clock signal, and a drain terminal of the ninth TFT is connected to the output terminal of the Nth-stage gate driving unit.

In one embodiment, the pull-down control module comprises a third TFT, a fourth TFT, a sixth TFT and an eighth TFT, wherein, a gate terminal of the third TFT receives the forward scan signal, a source terminal of the third TFT receives a (N+1)th-stage clock signal, and a drain terminal of the third TFT is connected to a gate terminal of the eighth TFT; a gate terminal of the fourth TFT receives the reverse scan signal, a source terminal of the fourth TFT receives a (N−1)th-stage clock signal, and a drain terminal of the fourth TFT is connected to the gate terminal of the eighth TFT; a gate terminal of the sixth TFT is connected to the drain terminal of the second TFT, a source terminal of the sixth TFT is connected to a drain terminal of the eighth TFT, and a drain terminal of the sixth TFT receives a low potential signal; a source terminal of the eighth TFT receives a first global control signal, and the drain terminal of the eighth TFT is connected to an output terminal of the pull-down control module. Wherein, the pull-down control module is configured to output the second control signal at the low potential to terminate the pull-down output module.

In one embodiment, the pull-down output module comprises a tenth TFT, a gate terminal of the tenth TFT is connected to the drain terminal of the eighth TFT, a source terminal of the tenth TFT receives a low potential signal, and a drain terminal of the tenth TFT is connected to the output terminal of the Nth-stage gate driving unit. Wherein, the pull-down output module is turned off under control of the second control signal and does not output any signal.

In one embodiment, the Nth-stage gate driving unit further comprises a reset module, the reset module comprises an eleventh TFT, a gate terminal and a source terminal of the eleventh TFT receive a reset signal, and a drain terminal of the eleventh TFT is connected to the drain terminal of the eighth TFT.

In one embodiment, the Nth-stage gate driving unit further comprises a global control module, the global control module comprises a twelfth TFT, a gate terminal of the twelfth TFT receives a second global control signal, a source terminal of the twelfth TFT receives a low potential signal, and a drain terminal of the twelfth TFT is connected to the output terminal of the Nth-stage gate driving unit.

In one embodiment, the Nth-stage gate driving unit further comprises a potential holding module, the potential holding module comprises a first capacitor and a second capacitor, wherein one terminal of the first capacitor is connected to the drain terminal of the first TFT and another terminal of the first capacitor receives a low potential signal: one terminal of the second capacitor is connected to the gate terminal of the fifth TFT and another terminal of the second capacitor receives a low potential signal.

In one embodiment, the forward scan signal is kept at the high potential and the reverse scan signal is kept at the low potential when the gate driving units scan forwardly, and the forward scan signal is kept at the low potential and the reverse scan signal is kept at the high potential when the gate driving units scan reversely.

In one embodiment, the gate terminal of the first TFT receives a starting signal in a first-stage gate driving unit and a second-stage gate driving unit of the gate driving circuit, and the gate terminal of the second TFT receives the starting signal in a last-stage gate driving unit and a penultimate-stage gate driving unit of the gate driving circuit.

Through performing the embodiments of the present disclosure, when power of the liquid crystal display is turned off, the pull-up control module generates the first control signal at high potential to conduct the pull-up output module to output high potential and the pull-down control module generates the second control signal at low potential to terminate the pull-down output module to not output signals, so that the high potential signal output from the pull-up output module passes through the output terminal of the Nth-stage gate driving unit connected to the pull-up output module and the pull-down output module. Through performing the embodiments of the present disclosure, the image on the display is cleaned quickly when power of the liquid crystal screen is turned off suddenly by all gate on function to prevent the liquid crystal screen from remaining image displayed previously.

BRIEF DESCRIPTION OF THE DRAWINGS

In order to make the descriptions of the technique solutions of the embodiments of the present invention or the existed techniques, the drawings necessary for describing the embodiments or the existed techniques are briefly introduced below. Obviously, the drawings described below are only some embodiments of the present invention, and, for those with ordinary skill in this field, other drawings can be obtained from the drawings described below without creative efforts.

DETAILED DESCRIPTION OF PREFERRED EMBODIMENTS

The technical solutions in the embodiments of the present disclosure will be described clearly and completely hereinafter with reference to the accompanying drawings in the embodiments of the present disclosure. Apparently, the described embodiments are merely some but not all embodiments of the present disclosure. All other embodiments obtained by persons with ordinary skill in the art based on the embodiments of the present invention without creative efforts shall fall within the protection scope of the present invention.

It is noted that, the terms used herein are only for illustrating concrete embodiments rather than limiting the exemplary embodiments. Unless otherwise indicated in the content, singular forms "a" and "an" also include plural. Moreover, the term "and/or" means and includes any or all possible combinations of one or more of the associated listed items.

The terms "comprising" and "including", as well as any variations thereof in the description and claims of the present disclosure and the above drawings, are intended to cover the inclusion of non-exclusive inclusions. For example, comprising a process, method, system, product, or device that incorporates a series of steps or units is not limited to the steps or units listed but may optionally further include steps or units not listed or may optionally further include other steps or units inherent to these processes, methods, products, or devices.

It is noted that, the embodiments of the present disclosure are described in detail below. Examples of the embodiments are shown in the accompanying drawings, where the same or similar reference numbers indicate the same or similar elements or elements having the same or similar functions from beginning to end. The embodiments described below with reference to the accompanying drawings are exemplary only to explain the present invention and should not be construed as limiting the present invention.

The following disclosure provides many different embodiments or examples for implementing different structures of the present invention. In order to simplify the disclosure of the present invention, the specific examples of the components and arrangements are described below. Of course, they are merely examples and are not intended to limit the present invention. In addition, the present disclosure may repeat reference numerals and/or letters in various examples. This repetition is for the purpose of simplification and clarity and does not by itself indicate the relationship between the various embodiments and/or arrangements discussed.

In the description of the present disclosure, it should be noted that the terms "mounted", "connect with", "connect to" and "connect" should be broadly understood unless otherwise specified and limited. For example, they may be mechanical connections or electrical connections, or may be the intercommunication between the two components. The intercommunication may be direct connection or indirect connection through an intermediary medium. For those skilled in the art, the specific meanings of the above terms may be understood according to specific situations.

Figure 1:
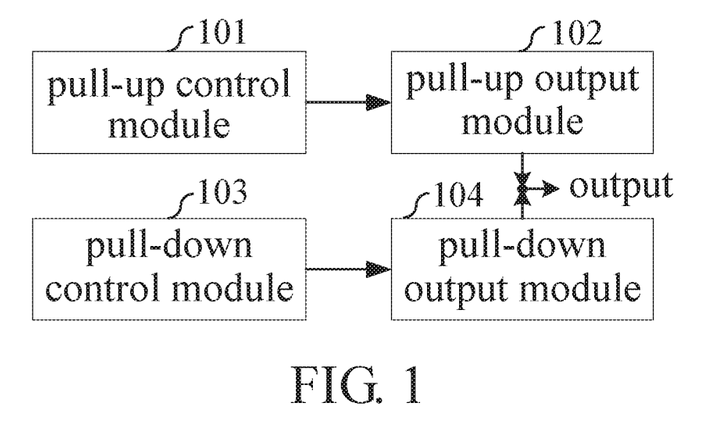
FIG. 1 is a function module schematic diagram of the gate driving unit provided in the first embodiment of the present disclosure.

The first embodiment of the present disclosure provides a gate driving circuit. The gate driving circuit comprises a plurality of gate driving units which are similar to each other and connected in cascaded stages. Assuming N is an integer, the Nth-stage gate driving unit can be found by referring to FIG. 1. FIG. 1 is a function module schematic diagram of the gate driving unit provided in the first embodiment of the present disclosure. As shown in FIG. 1, the gate driving unit in the embodiment of the present disclosure comprises following modules: the pull-up control module 101, the pull-up output module 102, the pull-down control module 103 and the pull-down output module 104.

In one embodiment, the pull-up control module 101 is configured to generate a first control signal when power of the gate driving circuit is turned off. Wherein, the first control signal is a high potential signal and used for controlling to conduct the pull-up output module 102.

In one embodiment, the pull-up output module 102 is configured to output a high potential to the output terminal of the Nth-stage gate driving unit under control of the first control signal when power of the gate driving circuit is turned off.

In one embodiment, the pull-down control module 103 is configured to generate a second control signal when power of the gate driving circuit is turned off. Wherein, the second control signal is a low potential signal and used for controlling to terminate the pull-down output module 104.

In one embodiment, the pull-down output module 104 is configured to output a low potential to the output terminal of the Nth-stage gate driving unit under control of the second control signal when power of the gate driving circuit is turned off.

Wherein, the pull-up control module 101 is connected to the pull-down control module 103 and the pull-up output module 102, the pull-up output module 102 is connected to the pull-down output module 104, the pull-down control module 103 is connected to the pull-down output module 104, and the output terminals of the pull-up output module and the pull-down output module connect to the output terminal of the Nth-stage gate driving unit.

Wherein, the input signals of the pull-up control module 101 of the Nth-stage gate driving unit comprise a forward scan signal U2D, a reverse scan signal D2U, an output signal G(n−2) of the (N−2)th-stage gate driving unit, an output signal G(n+2) of the (N+2)th-stage gate driving unit, and a high potential signal UGH. The input signals of the pull-up output module 102 comprise the first control signal and a Nth-stage clock signal CK(n). The input signals of the pull-down control module 103 comprise the forward scan signal U2D, the reverse scan signal D2U, a (N+1)th-stage clock signal CK(n+1), a (N−1)th-stage clock signal CK(n−1), a first global control signal GAS1 and a low potential signal VGL. The input signals of the pull-down output module 104 comprise the second control signal output from the pull-down control module 103 and the low potential signal VGL.

When the display device displays image normally and the Nth-stage gate driving unit is in forward scanning, the forward scan signal U2D is kept as a high potential signal and the reverse scan signal U2D and the clock signals (including the Nth-stage clock signal CK(n), the (N+1)th-stage clock signal CK(n+1) and the (N−1)th-stage clock signal CK(n−1)) are kept as a low potential signal. Because the starting signal (Start Vertical signal, STV signal) of the gate driving circuit is kept as a low potential signal when the display device displays normally, so that each gate driving unit of the gate driving circuit outputs a low potential signal, wherein the STV signal is turned into a high potential signal when power of the gate driving circuit is turned off to activate the gate driving circuit. The STV signal is taken to be the output signal of the $0^{th}$-stage gate driving unit and is input to the pull-up control modules of the first-stage gate driving unit and second-stage gate driving unit.

When power of the display device is turned off during a normal display, the STV signal is turned into a high potential signal from the low potential signal to activate the gate driving circuit, the forward scan signal U2D is kept as the high potential signal, the reverse scan signal D2U and the clock signal CK are turned into high potential signals from low potential signals, and the first global control signal GAS1 is turned into a low potential signal from the high potential signal.

In the situation of power off, variations of the potentials of the signals makes the pull-up control module 101 output the first control signal at high potential under the affections of the forward scan signal U2D, the output signal G(n−2) of the (N−2)th-stage gate driving unit, the output signal G(n+2) of the (N+2)th-stage gate driving unit and the high potential signal VGH. The pull-down control module 103 outputs the second control signal at low potential under the affections of the forward scan signal U2D, the reverse scan signal D2U, the (N+1)th-stage clock signal CK(n+1), the (N−1)th-stage clock signal CK(n−1), the first global control signal GAS1 and the low potential signal VGL. The pull-up output module 102 is conducted under the affections of the first control signal to output the Nth-stage clock signal CK(n) at high potential to the output terminal of the Nth-stage gate driving unit. The pull-down output module 104 is terminated under the affections of the second control signal to prevent the low potential signal VGL from being transmitted to the output terminal of the Nth-stage gate driving unit, so that the signal G(n) output from the out terminal of the Nth-stage gate driving unit is at high potential. Similarly, each gate driving unit of the gate driving circuit outputs high potential signal to realize all gate on function so that residual image on the display device is prevented.

It can be found that, through performing the embodiments of the present disclosure, when power of the liquid crystal display is turned off, the pull-up control module generates the first control signal at high potential to conduct the pull-up output module to output high potential and the pull-down control module generates the second control signal at low potential to terminate the pull-down output module to not output signals, so that the high potential signal output from the pull-up output module passes through the output terminal of the Nth-stage gate driving unit connected to the pull-up output module and the pull-down output module. Through performing the embodiments of the present disclosure, the image on the display is cleaned quickly when power of the liquid crystal screen is turned off suddenly by all gate on function to prevent the liquid crystal screen from remaining image displayed previously.

Figure 2:
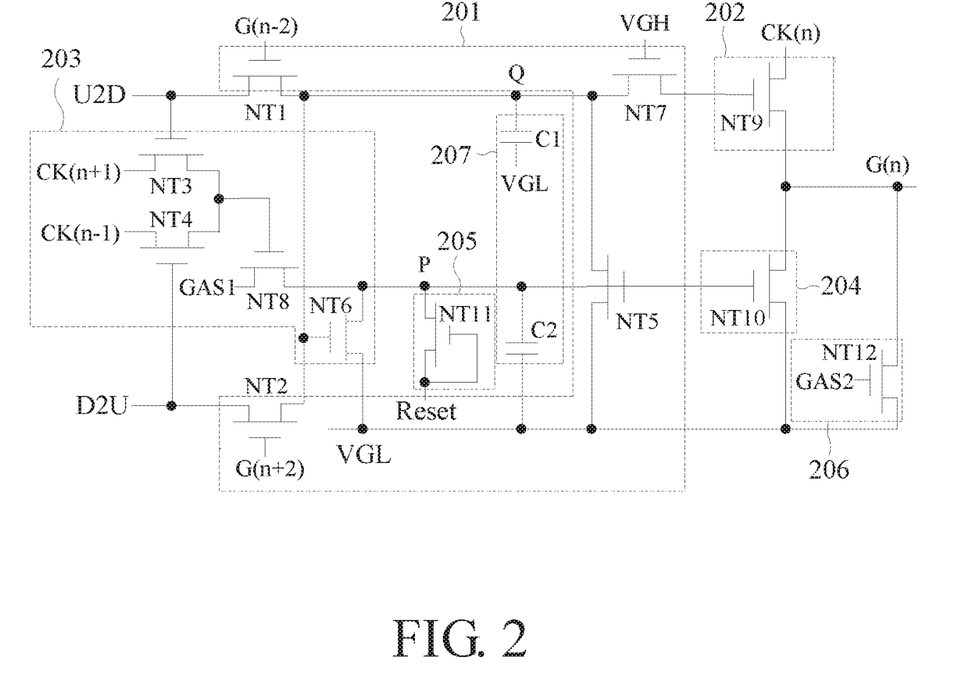
FIG. 2 is a circuit diagram of the gate driving unit provided in the second embodiment of the present disclosure.

The second embodiment of the present disclosure provides a gate driving circuit comprising a plurality of gate driving units which are similar to each other and connected in cascaded stages. Assuming N is an integer, the Nth-stage gate driving unit can be found by referring to FIG. 2. FIG. 2 is a circuit diagram of the gate driving unit provided in the second embodiment of the present disclosure. As shown in FIG. 2, the Nth-stage gate driving unit comprises the pull-up control module 201, the pull-up output module 202, the pull-down control module 203, the pull-down output module 204, the reset module 205, the global control module 206 and the potential holding module 207.

The pull-up control module 201 is configured to generate a first control signal when power of the gate driving circuit is turned off. Wherein, the first control signal is a high potential signal and used for controlling to conduct the pull-up output module 202 when power is turned off.

The pull-up output module 202 is configured to output a high potential to the output terminal of the Nth-stage gate driving unit under affection of the first control signal when power of the gate driving circuit is turned off.

The pull-down control module 203 is configured to generate a second control signal when power of the gate driving circuit is turned off. Wherein, the second control signal is a low potential signal and used for controlling to terminate the pull-down output module 204.

The pull-down output module 104 is configured to output a low potential to the output terminal of the Nth-stage gate driving unit under affection of the second control signal when power of the gate driving circuit is turned off.

The reset module 205 is configured to control the conduction and termination of the pull-down output module 204 under affection of the reset signal Reset.

The global control module 206 is configured to control the output signal of the Nth-stage gate driving unit under affection of the second global control signal GAS2.

The potential holding module 207 is configured to hold the potentials of the node P and node Q of the Nth-stage gate driving unit.

Wherein, the pull-up control module 201, the pull-up output module 202, the pull-down control module 203 and the potential holding module 207 are connected to the node Q, the pull-up control module 201, the pull-down control module 203, the pull-down output module 204, the reset module 205 and the potential holding module 207 are connected to the node P, and the pull-up output module 202, the pull-down output module 203 and the output terminal of the global control module 206 are connected to the output terminal of the Nth-stage gate driving unit.

The input signals of the pull-up control module 201 of the Nth-stage gate driving unit comprise the forward scan signal U2D, the reverse scan signal D2U, the output signal G(n−2) of the (N−2)th-stage gate driving unit, the output signal G(n+2) of the (N+2)th-stage gate driving unit, and the high potential signal VGH. The input signals of the pull-up output module 202 comprise the first control signal and the Nth-stage clock signal CK(n). The input signals of the pull-down control module 203 comprise the forward scan signal U2D, the reverse scan signal D2U, the (N+1)th-stage clock signal CK(n+1), the (N−1)th-stage clock signal CK(n−1), the first global control signal GAS1 and the low potential signal VGL. The input signals of the pull-down output module 204 comprise the second control signal output from the pull-down control module 203 and the low potential signal VGL. The input signals of the reset module 205 comprise the reset signal Reset. The input signals of the global control module 206 comprise the second global control signal GAS2 and the low potential signal VGL. The input signals of the potential holding module 207 comprise the low potential signal VGL.

When the display device displays image normally and the Nth-stage gate driving unit is in forward scanning, the forward scan signal U2D and the first global control signal GAS1 are kept as a high potential signal and the reverse scan signal U2D, the clock signals (including the Nth-stage clock signal CK(n), the (N+1)th-stage clock signal CK(n+1) and the (N−1)th-stage clock signal CK(n−1)), the second global control signal GAS2 and the reset signal Reset are kept as a low potential signal. Because the starting signal (Start Vertical signal, STV signal) of the gate driving circuit is kept as a low potential signal when the display device displays normally, so that each gate driving unit of the gate driving circuit outputs a low potential signal, wherein the STV signal is turned into a high potential signal to activate the gate driving circuit when power of the gate driving circuit is turned off. The STV signal is taken to be the output signal of the $0^{th}$-stage gate driving unit and is input to the pull-up control modules of the first-stage gate driving unit and second-stage gate driving unit.

When power of the display device is turned off during a normal display, the STV signal is turned into a high potential signal from the low potential signal to activate the gate driving circuit, the forward scan signal U2D is kept as the high potential signal, the second global control signal GAS2 and the reset signal Reset are kept at low potential, the reverse scan signal D2U and the clock signal CK are turned into high potential signals from low potential signals, and the first global control signal GAS1 is turned into a low potential signal from the high potential signal.

In the situation of power off described above, variations of the potentials of the signals makes the pull-up control module 201 output the first control signal at high potential under the affections of the forward scan signal U2D, the output signal G(n−2) of the (N−2)th-stage gate driving unit, the output signal G(n+2) of the (N+2)th-stage gate driving unit and the high potential signal VGH. The pull-down control module 203 outputs the second control signal at low potential under the affections of the forward scan signal U2D, the reverse scan signal D2U, the (N+1)th-stage clock signal CK(n+1), the (N−1)th-stage clock signal CK(n−1), the first global control signal GAS1 and the low potential signal VGL. The pull-up output module 202 is conducted under the affections of the first control signal to output the Nth-stage clock signal CK(n) at high potential to the output terminal of the Nth-stage gate driving unit. The pull-down output module 204 is terminated under the affections of the second control signal to prevent the low potential signal VGL from being transmitted to the output terminal of the Nth-stage gate driving unit, so that the signal G(n) output from the out terminal of the Nth-stage gate driving unit is at high potential. Similarly, each gate driving unit of the gate driving circuit outputs high potential signal to realize all gate on function so that image on the display device is cleaned quickly and residual image on the display device is prevented when the liquid crystal screen is powered off.

The Nth-stage gate driving unit and the modules thereof are described in detail below combining with FIG. 2.

Specifically, the pull-up control module 201 comprises the first thin film transistor (TFT) NT1, the second TFT NT2, the fifth TFT NT5 and the seventh TFT NT7, wherein the gate terminal of the seventh TFT NT7 is the output terminal of the pull-up control module 201.

Wherein, the gate terminal of the first TFT NT1 receives the output signal G(n−2) of the (N−2)th-stage gate driving unit, the source terminal of the first TFT NT1 receives the forward scan signal U2D, and the drain terminal of the first TFT NT1 is connected to the drain terminal of the second TFT NT2. The gate terminal of the second TFT NT2 receives the output signal G(n+2) of the (N+2)th-stage gate driving unit, and the source of the second TFT NT2 receives the reverse scan signal D2U. The gate terminal of the fifth TFT NT5 is connected to the output terminal of the pull-down control module 203, the source terminal of the fifth TFT NT5 is connected to the drain terminal of the first TFT NT1, and a drain terminal of the fifth TFT NT5 receives the low potential signal VGL. The gate terminal of the seventh TFT NT7 receives the high potential signal VGH, the source terminal of the seventh TFT NT7 is connected to the drain terminal of the first TFT NT1, and the drain terminal of the seventh TFT NT7 is connected to the output terminal of the pull-up control module 201.

The pull-up output module 202 comprises the ninth TFT NT9. The gate terminal of the ninth TFT NT9 is connected to the output terminal of the pull-up control module 201, a source terminal of the ninth TFT NT9 receives the first clock signal CK(n), and the drain terminal of the ninth TFT NT9 is connected to the output terminal of the Nth-stage gate driving unit.

The pull-down control module 203 comprises the third TFT NT3, the fourth TFT NT4, the sixth TFT NT6 and the eighth TFT NT8, wherein the drains of the sixth TFT NT6 and eighth TFT NT8 are connected together as the output terminal of the pull-down control module 203. The gate terminal of the third TFT NT3 receives the forward scan signal U2D, the source terminal of the third TFT NT3 receives the (N+1)th-stage clock signal CK(n+1), and the drain terminal of the third TFT NT3 is connected to the gate terminal of the eighth TFT. The gate terminal of the fourth TFT NT4 receives the reverse scan signal D2U, the source terminal of the fourth TFT NT4 receives the (N−1)th-stage clock signal CK(n−1), and the drain terminal of the fourth TFT NT4 is connected to the gate terminal of the eighth TFT NT8. The gate terminal of the sixth TFT NT6 is connected to the drain terminal of the second TFT NT2, the source terminal of the sixth TFT NT6 is connected to the drain terminal of the eighth TFT NT8, and the drain terminal of the sixth TFT NT6 receives the low potential signal VGL. The gate terminal of the eighth TFT NT8 is connected to the drain terminals of the third TFT NT3 and fourth TFT NT4, the source terminal of the eighth TFT NT8 receives the first global control signal GAS1, and the drain terminal of the eighth TFT NT8 is connected to the drain terminal of the sixth TFT NT6.

The pull-down output module 204 comprises the tenth TFT NT10, wherein the gate terminal of the tenth TFT NT10 is connected to the drain terminals of the sixth TFT NT6 and eighth TFT NT8, the source terminal of the tenth TFT NT10 receives the low potential signal VGL, and the drain terminal of the tenth TFT NT10 is connected to the output terminal of the Nth-stage gate driving unit.

The reset module 205 comprises the eleventh TFT NT11, wherein the gate terminal and the source terminal of the eleventh TFT NT11 receive the reset signal Reset, and the drain terminal of the eleventh TFT NT11 is connected to the gate terminal of the tenth TFT NT10.

The global control module 206 comprises the twelfth TFT, wherein the gate terminal of the twelfth TFT NT12 receives the second global control signal GAS2, the source terminal of the twelfth TFT NT12 receives the low potential signal VGL, and the drain terminal of the twelfth TFT NT12 is connected to the output terminal of the Nth-stage gate driving unit.

The potential holding module 207 comprises the first capacitor C1 and the second capacitor C2, wherein, one terminal of the first capacitor C1 is connected to the drain terminal of the first TFT NT1 and another terminal of the first capacitor C1 receives the low potential signal VGL, and one terminal of the second capacitor C2 is connected to the drain terminal of the eighth TFT NT8 and another terminal of the second capacitor receives the low potential signal VGL.

The operation processes of the Nth-stage gate driving unit under control of the timings of the signals are described below with reference to the circuit diagram of the Nth-stage gate driving unit shown in FIG. 2 and the timing sequence diagram of the gate driving unit of the second embodiment of the present disclosure shown in FIG. 3.

Figure 3:
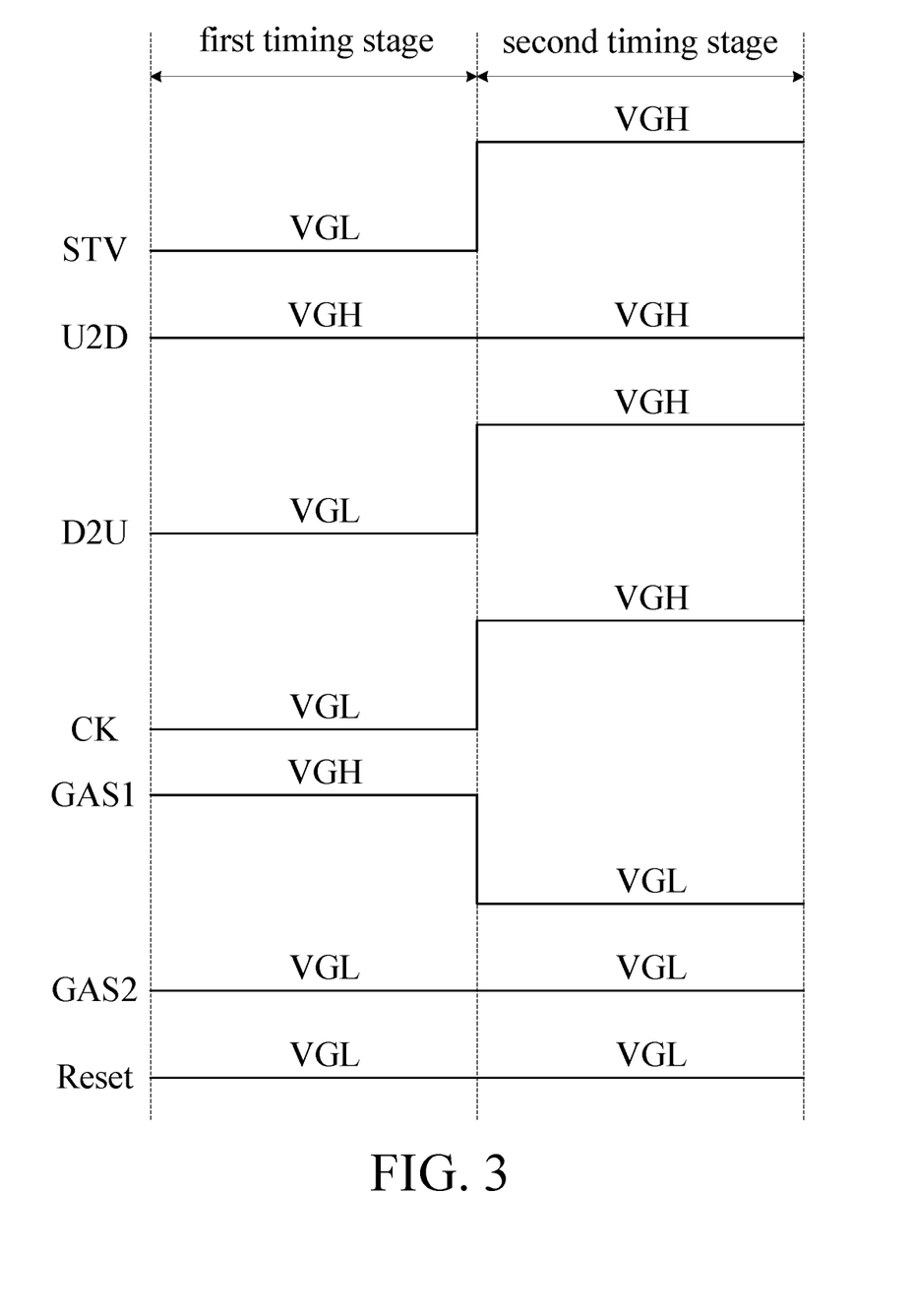
FIG. 3 is a timing sequence of the gate driving unit according to the second embodiment of the present disclosure.

In the first timing stage shown in FIG. 3, when the display device displays image normally, the starting (Start Vertical, STV) signal, the reverse scan signal D2U, the clock signal CK (including the Nth-stage clock signal CK(n), the (N+1)th-stage clock signal CK(n+1) and the (N−1)th-stage clock signal CK(n−1)), the second global control signal GAS2 and the reset signal Reset are kept as a low potential signal and are at low potential. Wherein, the STV signal is input to the gate terminals of the first TFT's NT1 of the first-stage gate driving unit and second-stage gate driving unit. Because the STV signal is kept at low potential, the first TFT NT1's of the first-stage gate driving unit and second-stage gate driving unit are turned off and there is no signal output from the pull-up control modules corresponding to the first-stage and second-stage gate driving units, so that the pull-up output modules corresponding to the first-stage and second-stage gate driving units are turned off and there is no signal output to the output terminals of the first-stage and second-stage gate driving units.

It can be understood that, because the clock signals CK and the reset signal Reset are at low potential when the display device displays image normally, the eighth TFT's NT8 and the eleventh TFT's NT11 of the first-stage and second-stage gate driving units are turned off, so that there is no signal output from the pull-down control modules corresponding to the first-stage and second-stage gate driving units and the pull-down output modules corresponding to the first-stage and second-stage gate driving units are turned off thereby, so that there is no signal output from the output terminals of the first-stage and second-stage gate driving units. Therefore, the output terminals of the first-stage and second-stage gate driving units do not output signals. It is concluded that the signal G(n−2) input to the gate terminal of the first TFT NT1 of the Nth-stage gate driving unit is zero, and the Nth-stage gate driving unit does not output signals.

It can be found from the second timing stage in FIG. 3 that, when power of the display device is turned off during normally displaying images, the STV signal is turned into a high potential signal from the low potential signal to activate the gate driving circuit, the forward scan signal U2D is kept as the high potential signal, the second global control signal GAS2 and the reset signal Reset are kept at low potential, the reverse scan signal D2U and the clock signals CK are turned into high potential signals from the low potential signals, and the first control signal GAS1 is turned into a low potential signal from the high potential signal. Therefore, in the first-stage driving unit and second-stage driving unit, the first TFT's NT1 are turned on and the seventh TFT's NT7 are turned on under control of the high potential signal VGH, so that the forward scan signal U2D at high potential is transmitted to the gate terminals of the ninth TFT's through the first TFT's NT1 and seventh TFT's NT7 thereby conducting the ninth TFT's NT9, and the clock signals CK at high potential are transmitted to the output terminals of the first-stage and second-stage gate driving units.

It can be understood that, because the reverse scan signal D2U is changed to be at high potential, the third TFT's NT3 and fourth TFT's NT4 of the first-stage and second-stage gate driving units are turned on and the clock signals CK at high potential are transmitted to the gate terminals of the eighth TFT's NT8 through the third TFT's NT3 and fourth TFT's NT4 to turn on the eighth TFT's NT8, so that the first global control signal GAS1 at low potential flows to the gate terminals of the tenth TFT's NT10 to turn off the tenth TFT's NT10 and therefore there is no signal output to the output terminals of the first-stage and second-stage gate driving units. Furthermore, because the second global control signal GAS2 is kept as the low potential signal, the twelfth TFT's NT12 are turned off and there is no signals output to the output terminals of the first-stage and second-stage gate driving units. Therefore, in the first-stage and second-stage gate driving units, there are only the clock signals at high potential flow into the output terminals of the first-stage and second-stage gate driving units through the ninth TFT's NT9 so that the first-stage and second-stage gate driving units output the high potential signals thereby.

It can be understood that, through the variations in the timing sequence and of the output signals of the gate driving unit when power of the display device is turned off during normally displaying images, the signal G(n−2) input to the gate terminal of the first TFT NT1 of the Nth-stage gate driving unit is at high potential and the first TFT NT1 is turned on, and the seventh TFT NT7 is also turned on under control of the high potential signal VGH so that the forward scan signal U2D at high potential is transmitted to the gate terminal of the ninth TFT NT9 to turn on the ninth TFT NT9 through the first TFT NT1 and ninth TFT NT9 and, furthermore, the clock signal CK at high potential is transmitted to the output terminals of the first-stage and second-stage gate driving units through the ninth TFT NT9. It can be found from similar analysis that, because the reverse scan signal D2U is changed to be at high potential, the third TFT NT3 and the fourth TFT NT4 of the Nth-stage gate driving unit are turned on, the clock signal OK at high potential is transmitted to the gate terminal of the eighth TFT NT8 through the third TFT NT3 and the fourth TFT NT4 to turn on the eighth TFT NT8 so that the first global control signal GAS1 at low potential flows to the gate terminal of the tenth TFT NT10 to turn off the tenth TFT NT10, and, therefore, there is no signal output to the output terminal of the Nth-stage gate driving unit. Accordingly, in the Nth-stage gate driving unit, only the clock signal CK(n) at high potential is transmitted to the output terminal of the Nth-stage gate driving unit through the ninth TFT NT9 to make the Nth-stage gate driving unit output the high potential signal.

It can be known from the analysis above that, when power is turned off, each gate driving unit in the gate driving circuit outputs the high potential signal so that the All Gate On function can be realized.

Through performing the embodiments of the present disclosure, when power of the liquid crystal display is turned off, the pull-up control module generates the first control signal at high potential to conduct the pull-up output module to output high potential and the pull-down control module generates the second control signal at low potential to terminate the pull-down output module to not output signals, so that the high potential signal output from the pull-up output module passes through the output terminal of the Nth-stage gate driving unit connected to the pull-up output module and the pull-down output module to realize All Gate On function, clean the image on the display quickly and prevent the liquid crystal screen from remaining the image displayed previously when power of the liquid crystal screen is turned off suddenly.

One with ordinary skill in the art may understand that all or part of the processes for implementing the methods in the foregoing embodiments may be implemented by a computer program instructing relevant hardware. The program may be stored in a computer-readable storage medium, and, when the program is executed, the flow of the embodiments of the above methods may be included. The storage medium may be a magnetic disk, an optical disk, a read-only memory (ROM), a random access memory (RAM), or the like.

The foregoing contents are detailed description of the disclosure in conjunction with specific preferred embodiments and concrete embodiments of the disclosure are not limited to the description. For the person skilled in the art of the disclosure, without departing from the concept of the disclosure, simple deductions or substitutions can be made and should be included in the protection scope of the application.

What is claimed is:

1. A gate driving circuit, comprising a plurality of gate driving units, wherein a Nth-stage gate driving unit comprises:
    a pull-up control module configured to generate a first control signal when power is turned off;
    a pull-up output module configured to output a high potential under control of the first control signal;
    a pull-down control module configured to generate a second control signal when power is turned off; and
    a pull-down output module configured to output a low potential under control of the second control signal;
    wherein, an output terminal of the pull-up output module and an output terminal of the pull-down output module are connected to an output terminal of the Nth-stage gate driving unit, and, when power is turned off, the pull-up output module and the pull-down output module make the output terminal of the Nth-stage gate driving unit output the high potential;
    wherein the pull-up control module comprises a first thin film transistor (TFT), a second TFT, a fifth TFT and a seventh TFT, wherein,
    a gate terminal of the first TFT receives an output signal of a (N−2)th-stage gate driving unit, a source terminal of the first TFT receives a forward scan signal, and a drain terminal of the first TFT is connected to a drain terminal of the second TFT;
    a gate terminal of the second TFT receives an output signal of a (N+2)th-stage gate driving unit, and a source of the second TFT receives a reverse scan signal;
    a gate terminal of the fifth TFT is connected to an output terminal of the pull-down control module, a source terminal of the fifth TFT is connected to the drain terminal of the first TFT, and a drain terminal of the fifth TFT receives a low potential signal;
    a gate terminal of the seventh TFT receives a high potential signal, a source terminal of the seventh TFT is connected to the drain terminal of the first TFT, and a drain terminal of the seventh TFT is connected to an output terminal of the pull-up control module;
    wherein the pull-up control module is configured to output the first control signal at the high potential to conduct the pull-up output module.

2. The gate driving circuit according to claim 1, wherein the pull-up output module comprises a ninth TFT, a gate terminal of the ninth TFT is connected to an output terminal of the pull-up control module, a source terminal of the ninth TFT receives a first clock signal, and a drain terminal of the ninth TFT is connected to the output terminal of the Nth-stage gate driving unit.

3. The gate driving circuit according to claim 1, wherein the pull-down control module comprises a third TFT, a fourth TFT, a sixth TFT and an eighth TFT, wherein,
    a gate terminal of the third TFT receives a forward scan signal, a source terminal of the third TFT receives a (N+1)th-stage clock signal, and a drain terminal of the third TFT is connected to a gate terminal of the eighth TFT;
    a gate terminal of the fourth TFT receives a reverse scan signal, a source terminal of the fourth TFT receives a (N−1)th-stage clock signal, and a drain terminal of the fourth TFT is connected to the gate terminal of the eighth TFT;
    a gate terminal of the sixth TFT is connected to a drain terminal of a second TFT, a source terminal of the sixth TFT is connected to a drain terminal of the eighth TFT, and a drain terminal of the sixth TFT receives a low potential signal;
    a source terminal of the eighth TFT receives a first global control signal, and the drain terminal of the eighth TFT is connected to an output terminal of the pull-down control module;
    wherein the pull-down control module is configured to output the second control signal at the low potential to terminate the pull-down output module.

4. The gate driving circuit according to claim 1, wherein the pull-down output module comprises a tenth TFT, a gate terminal of the tenth TFT is connected to a drain terminal of an eighth TFT, a source terminal of the tenth TFT receives a low potential signal, and a drain terminal of the tenth TFT is connected to the output terminal of the Nth-stage gate driving unit.

5. The gate driving circuit according to claim 4, wherein the Nth-stage gate driving unit further comprises a reset module, the reset module comprises an eleventh TFT, a gate terminal and a source terminal of the eleventh TFT receive a reset signal, and a drain terminal of the eleventh TFT is connected to the drain terminal of the eighth TFT.

6. The gate driving circuit according to claim 5, wherein the Nth-stage gate driving unit further comprises a global control module, the global control module comprises a twelfth TFT, a gate terminal of the twelfth TFT receives a second global control signal, a source terminal of the twelfth TFT receives a low potential signal, and a drain terminal of the twelfth TFT is connected to the output terminal of the Nth-stage gate driving unit.

7. The gate driving circuit according to claim 6, wherein the Nth-stage gate driving unit further comprises a potential holding module, the potential holding module comprises a first capacitor and a second capacitor, wherein one terminal of the first capacitor is connected to a drain terminal of a first TFT and another terminal of the first capacitor receives a low potential signal; one terminal of the second capacitor is connected to a gate terminal of a fifth TFT and another terminal of the second capacitor receives the low potential signal.

8. The gate driving circuit according to claim 7, wherein a forward scan signal is kept at the high potential and a reverse scan signal is kept at the low potential when the gate driving units scan forwardly, and the forward scan signal is kept at the low potential and the reverse scan signal is kept at the high potential when the gate driving units scan reversely.

9. The gate driving circuit according to claim 1, wherein a gate terminal of a first TFT receives a starting signal in a first-stage gate driving unit and a second-stage gate driving unit of the gate driving circuit, and a gate terminal of a second TFT receives the starting signal in a last-stage gate driving unit and a penultimate-stage gate driving unit of the gate driving circuit.

10. A gate driving circuit, comprising a plurality of gate driving units,
    wherein a Nth-stage gate driving unit comprises:
    a pull-up control module configured to generate a first control signal when power is turned off;
    a pull-up output module configured to output a high potential under control of the first control signal;
    a pull-down control module configured to generate a second control signal when power is turned off; and
    a pull-down output module configured to output a low potential under control of the second control signal;
    wherein, an output terminal of the pull-up output module and an output terminal of the pull-down output module are connected to an output terminal of the Nth-stage gate driving unit, and, when power is turned off, the pull-up output module and the pull-down output module make the output terminal of the Nth-stage gate driving unit output the high potential;
    wherein the pull-down control module comprises a third TFT, a fourth TFT, a sixth TFT and an eighth TFT, wherein,
    a gate terminal of the third TFT receives a forward scan signal, a source terminal of the third TFT receives a (N+1)th-stage clock signal, and a drain terminal of the third TFT is connected to a gate terminal of the eighth TFT;
    a gate terminal of the fourth TFT receives a reverse scan signal, a source terminal of the fourth TFT receives a (N−1)th-stage clock signal, and a drain terminal of the fourth TFT is connected to the gate terminal of the eighth TFT;
    a gate terminal of the sixth TFT is connected to a drain terminal of a second TFT, a source terminal of the sixth TFT is connected to a drain terminal of the eighth TFT, and a drain terminal of the sixth TFT receives a low potential signal;
    a source terminal of the eighth TFT receives a first global control signal, and the drain terminal of the eighth TFT is connected to an output terminal of the pull-down control module;
    wherein the pull-down control module is configured to output the second control signal at the low potential to terminate the pull-down output module.

11. The gate driving circuit according to claim 10, wherein the pull-up control module comprises a first thin film transistor (TFT), a second TFT, a fifth TFT and a seventh TFT, wherein,
    a gate terminal of the first TFT receives an output signal of a (N−2)th-stage gate driving unit, a source terminal of the first TFT receives a forward scan signal, and a drain terminal of the first TFT is connected to a drain terminal of the second TFT;
    a gate terminal of the second TFT receives an output signal of a (N+2)th-stage gate driving unit, and a source of the second TFT receives a reverse scan signal;
    a gate terminal of the fifth TFT is connected to an output terminal of the pull-down control module, a source terminal of the fifth TFT is connected to the drain terminal of the first TFT, and a drain terminal of the fifth TFT receives a low potential signal;
    a gate terminal of the seventh TFT receives a high potential signal, a source terminal of the seventh TFT is connected to the drain terminal of the first TFT, and a drain terminal of the seventh TFT is connected to an output terminal of the pull-up control module;
    wherein the pull-up control module is configured to output the first control signal at the high potential to conduct the pull-up output module.

12. The gate driving circuit according to claim 10, wherein the pull-up output module comprises a ninth TFT, a gate terminal of the ninth TFT is connected to an output terminal of the pull-up control module, a source terminal of the ninth TFT receives a first clock signal, and a drain terminal of the ninth TFT is connected to the output terminal of the Nth-stage gate driving unit.

13. The gate driving circuit according to claim 10, wherein the pull-down output module comprises a tenth TFT, a gate terminal of the tenth TFT is connected to a drain terminal of an eighth TFT, a source terminal of the tenth TFT receives a low potential signal, and a drain terminal of the tenth TFT is connected to the output terminal of the Nth-stage gate driving unit.

14. The gate driving circuit according to claim 13, wherein the Nth-stage gate driving unit further comprises a reset module, the reset module comprises an eleventh TFT, a gate terminal and a source terminal of the eleventh TFT receive a reset signal, and a drain terminal of the eleventh TFT is connected to the drain terminal of the eighth TFT.

15. The gate driving circuit according to claim 14, wherein the Nth-stage gate driving unit further comprises a global control module, the global control module comprises a twelfth TFT, a gate terminal of the twelfth TFT receives a second global control signal, a source terminal of the twelfth TFT receives a low potential signal, and a drain terminal of the twelfth TFT is connected to the output terminal of the Nth-stage gate driving unit.

16. The gate driving circuit according to claim 15, wherein the Nth-stage gate driving unit further comprises a potential holding module, the potential holding module comprises a first capacitor and a second capacitor, wherein one terminal of the first capacitor is connected to a drain terminal of a first TFT and another terminal of the first capacitor receives a low potential signal; one terminal of the second capacitor is connected to a gate terminal of a fifth TFT and another terminal of the second capacitor receives the low potential signal.

17. The gate driving circuit according to claim 16, wherein a forward scan signal is kept at the high potential and a reverse scan signal is kept at the low potential when the gate driving units scan forwardly, and the forward scan signal is kept at the low potential and the reverse scan signal is kept at the high potential when the gate driving units scan reversely.

18. The gate driving circuit according to claim 10, wherein a gate terminal of a first TFT receives a starting signal in a first-stage gate driving unit and a second-stage gate driving unit of the gate driving circuit, and a gate terminal of a second TFT receives the starting signal in a last-stage gate driving unit and a penultimate-stage gate driving unit of the gate driving circuit.

19. A gate driving circuit, comprising a plurality of gate driving units,
wherein a Nth-stage gate driving unit comprises:
a pull-up control module configured to generate a first control signal when power is turned off;
a pull-up output module configured to output a high potential under control of the first control signal;
a pull-down control module configured to generate a second control signal when power is turned off; and
a pull-down output module configured to output a low potential under control of the second control signal;
wherein a gate terminal of a first TFT receives a starting signal in a first-stage gate driving unit and a second-stage gate driving unit of the gate driving circuit, and a gate terminal of a second TFT receives the starting signal in a last-stage gate driving unit and a penultimate-stage gate driving unit of the gate driving circuit.

* * * * *